(12) United States Patent
Hayakawa et al.

(10) Patent No.: US 7,969,741 B2
(45) Date of Patent: Jun. 28, 2011

(54) SUBSTRATE STRUCTURE

(75) Inventors: Haruo Hayakawa, Kanagawa (JP);
Masahiro Ono, Kanagawa (JP); Seiji Yamaguchi, Tokyo (JP); Yoshihiro Uda, Kanagawa (JP); Kazuhiro Shinchi, Kanagawa (JP); Satoru Tomekawa, Kanagawa (JP); Kiyoshi Nakanishi, Kanagawa (JP); Kosuke Kubota, Kanagawa (JP); Atsushi Katagiri, Kanagawa (JP); Motohisa Kotani, Kanagawa (JP); Kazuhiro Konishi, Kanagawa (JP); Eiji Nishimura, Kanagawa (JP); Takeo Matsuki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 143 days.

(21) Appl. No.: 12/065,177

(22) PCT Filed: Feb. 20, 2006

(86) PCT No.: PCT/JP2006/302969
§ 371 (c)(1),
(2), (4) Date: Aug. 24, 2009

(87) PCT Pub. No.: WO2007/026439
PCT Pub. Date: Mar. 8, 2007

(65) Prior Publication Data
US 2010/0020497 A1    Jan. 28, 2010

(30) Foreign Application Priority Data
Aug. 30, 2005    (JP) ............................. 2005-250200

(51) Int. Cl.
*H05K 7/20* (2006.01)
(52) U.S. Cl. ........ 361/708; 361/705; 361/707; 361/719; 349/62; 362/627; 174/521

(58) Field of Classification Search ............. 361/679.34, 361/679.47, 688, 700, 704, 705, 719, 748
See application file for complete search history.

(56) References Cited

U.S. PATENT DOCUMENTS
5,991,155 A * 11/1999 Kobayashi et al. ........... 361/705
(Continued)

FOREIGN PATENT DOCUMENTS
CN    1280455 A    1/2001
(Continued)

OTHER PUBLICATIONS
International Search Report for PCT/JP2006/302969; Mar. 2, 2006.
(Continued)

*Primary Examiner* — Jayprakash N Gandhi
*Assistant Examiner* — Courtney Smith
(74) *Attorney, Agent, or Firm* — Seed IP Law Group PLLC

(57) ABSTRACT

It is intended to provide a substrate structure ensuring a shielding property and a heat discharge property of a resin part that collectively covers a plurality of electronic components and capable of downsizing, thinning, and a reduction in number of components. The substrate structure 20 of the first embodiment is provided with a substrate 21, a plurality of electronic components 22 mounted along the substrate 21, and a resin part 25 that covers the electronic components 22 and is in close contact with the substrate 21. In the substrate structure 20, the resin part 25 is provided with a reinforcing heat discharge layer 26 covering the electronic components 22 and having a heat conductivity and a reinforcing property and a shield layer 27 covering the reinforcing heat discharge layer 26, and a surface o28 of the shield layer 27 is formed into a predetermined shape corresponding to a surface structure of the display device 30 adjacent to the resin part 25.

7 Claims, 17 Drawing Sheets

U.S. PATENT DOCUMENTS

| | | |
|---|---|---|
| 6,628,526 B1 | 9/2003 | Oshima et al. |
| 6,940,712 B2 * | 9/2005 | Chu et al. ............... 361/679.47 |
| 2001/0019379 A1 * | 9/2001 | Ishihara et al. ............... 349/65 |
| 2002/0186333 A1 | 12/2002 | Ha et al. |
| 2004/0000710 A1 | 1/2004 | Oya |
| 2004/0183774 A1 | 9/2004 | Manabe et al. |
| 2004/0214496 A1 | 10/2004 | Yang |
| 2006/0126304 A1 * | 6/2006 | Smalc et al. ............... 361/704 |
| 2006/0215072 A1 | 9/2006 | Hashino |
| 2008/0165306 A1 * | 7/2008 | Kang et al. ............... 349/62 |

FOREIGN PATENT DOCUMENTS

| | | |
|---|---|---|
| JP | 10-104584 A | 4/1998 |
| JP | 2000-2602217 | 9/2000 |
| JP | 2001-24312 | 1/2001 |
| JP | 3241669 | 10/2001 |
| JP | 2002-341348 | 11/2002 |
| JP | 2004-31651 | 1/2004 |
| WO | 2004/088404 A1 | 10/2004 |

OTHER PUBLICATIONS

Office Action issued on Jun. 19, 2009, in corresponding Chinese Patent Application No. 200680035334.6.

European Search Report, mailed Dec. 6, 2010, for EP 06 71 4109, 7 pages.

* cited by examiner

SUBSTRATE STRUCTURE

TECHNICAL FIELD

This invention relates to a substrate structure wherein plural electronic components are mounted along a substrate, the electronic components are coated with a resin part, and the resin part is in close contact with the substrate.

RELATED ART

As a housing of a mobile terminal, there has recently been a demand for a small and thin housing that is reduced in number of components. In order to meet such demand, a substrate structure using a thin and flexible substrate has been used as a circuit substrate to be housed in the housing.

As shown in FIG. 19, a plurality of electronic components 202 that are mounted on a substrate 201 are collectively coated with a resin part 203 in such substrate structure 200.

With such constitution, mounting strength of the electronic components 202 with respect to the substrate 201 is ensured, and the substrate 201 is so reinforced as to maintain its flat plate-like shape.

A display device 206 such as an LCD to be provided on a mobile terminal 205 is disposed at a position corresponding to an opening 209 provided on a housing 208 by being supported by a support member 207 that is provided on the substrate 201 in such a fashion as to stride over the resin part 203.

As shown in FIG. 20, the display device 206 is obtainable by laminating a main body 211, an optical sheet 212, a light guiding plate 213, a reflection sheet 214, and the like and is housed in a frame part 216 of the support member 207.

As shown in FIG. 21, in the main body 211 of the display device 206, a terminal 219 is drawn out from a liquid crystal part (not shown) disposed between a pair of transparent substrates 218.

Also, on one end of the light guiding plate 213, a light guiding part 222 that is increased in thickness so as to form a substantially wedge-like shape in accordance with a form and a size of an LED 221 serving as a light source is provided. The light guiding part 222 is disposed in such a fashion as to rise along an identical plane with a lower surface of the light guiding plate 213 and toward the transparent substrates 218.

As the electronic components 202 to be mounted on the substrate 201, an electronic component required to have an electrical shielding property and an electronic component required to have a heat discharge property, i.e. electronic components having a high heat generating property, have been known.

However, since the conventional substrate structure 200 has the primary object of ensuring the mounting strength of the electronic components 202 and the function as a reinforcing material for maintaining the flatness of the substrate 201, the above-mentioned shielding property and the heat discharge property thereof is insufficient.

There has been proposed a reinforcing structure for an IC package wherein the IC package mounted on a mother board is covered with a reinforcing frame having a side surface part and a top surface part, and the reinforcing frame is filled with a resin (see Patent Publication 1, for example).
Patent Publication 1: Japanese Patent No. 3241669

DISCLOSURE OF THE INVENTION

Problems to be Solved by the Invention

Since a plurality of notches are provided on the reinforcing frame in Patent Publication 1, Patent Publication 1 fails to achieve the satisfactory shielding property.

Also, since the primary object of the Patent Publication 1 is to fix the IC package on the mother board, the electronic components having heat discharge property are not considered in the Patent Publication 1.

Further, the demand for downsizing, thinning, and reduction in number of components of the housing 208 of the mobile terminal 206 is becoming complicated since the presence of the support member 207 or the support structure of the display device 206 serves as impediment for downsizing, thinning, and reducing components of the housing 208.

That is, when the transparent substrates 218 are made thinner for thinning the display device 206, the terminal 219 of the liquid crystal part and the LED 221 of the light guiding plate 213 come close to each other, thereby raising a risk of contact.

It is difficult to provide fundamental solution to such problem due to the structure wherein the light guiding part 222 is disposed as to rise toward the transparent substrates 218.

In contrast, a structure wherein the light guiding part 222 is disposed in such a fashion as to rise toward a direction departing from the transparent substrates 218, and a recessed part or a hole for housing the light guiding part 222 is formed on a platform of the support member may be considered.

However, since the platform 207A of the support member 207 has already been reduced in thickness with its strength for placing thereon the display device 206 being ensured, the structure of forming the recessed part and the hole is not preferable from the viewpoint of strength.

Also, a structure wherein the electronic components 202 are mounted on a reverse side of the substrate 201, the light guiding part is disposed in such a fashion as to rise toward the direction departing from the transparent substrates, and a recessed part or a hole for housing the light guiding part is formed on a platform of the support member may be considered.

However, such structure can be impediment in view of circuit designing in recent multilayer substrates and has difficulty in further improving flexible substrates that have already reduced in thickness.

Also, such substrate structure 200 raise a problem of not contributing to an overall thinning even when the display device 206 is directly supported on the surface of the substrate 201, since the electronic components 202 are mounted on the reverse side of the substrate 201.

This invention has been accomplished in order to solve the above-described conventional problems, and a first object thereof is to provide a substrate structure ensuring a shielding property and a heat discharge property of a resin part that collectively covers a plurality of electronic components and capable of downsizing, thinning, and reducing the number of components.

Also, a second object of this invention is to provide a substrate structure less subject to damage when a load is applied on a lamination member and capable of improving strength as compared to conventional examples.

Means for Solving the Problems

A substrate structure of this invention comprises: a substrate; a plurality of electronic components mounted along the substrate; and a resin part coating the electronic components with a resin and in close contact with the substrate, the substrate structure being characterized in that: the resin part comprises a reinforcing heat discharge layer covering the electronic components and having a heat conductivity and a reinforcing property and a shield layer covering the reinforcing heat discharge layer; and the shield layer has a surface formed into a predetermined shape corresponding to a surface shape of another member adjacent to the resin part.

Since the resin part comprises the reinforcing heat discharge layer covering the electronic components and the shield layer covering the reinforcing heat discharge layer, a heat discharge property and a shielding property are ensured for the electronic components.

The surface of the shield layer is formed into the predetermined shape corresponding to the surface shape of another member. Therefore, it is possible to omit the conventional support member, and it is possible to support the member in such a fashion that the member is recessed as compared to the conventional examples by forming a recessed part as required.

With such constitution, it is possible to achieve downsizing, thinning, and reduction in number of components of a mobile terminal.

Also, this invention is characterized by comprising a platform provided on the surface of the shield layer to enable a display device to be placed thereon and a wall part provided upright around the platform and sorrowing the display device.

The recessed part is formed by providing the platform on the surface of the shield layer and providing the wall part upright around the platform. By housing the display device in the recessed part, it is possible to support and protect the member by the shield layer.

Further, this invention is characterized in that a recessed part corresponding to a projection of the display device is provided on the platform.

By providing the recessed part corresponding to the projection of the display device on the platform, it is possible to house the projection of the display device in the recessed part. Therefore, it is possible to place the display device on the platform in a state where the display device is in contact with the platform and prevented from floating up from the platform of the shield layer.

Also, this invention is characterized in that the platform is a light guiding plate inclined surface of the display device, and any of the electronic components having a large mounting height is/are disposed at an upstream in an inclination direction of the platform.

By forming the platform as the light guiding plate inclined surface of the display device, it is possible to reflect light made incident from one end face of the light guiding plate by the inclined surface to uniformly exit the light from a surface of the light guiding plate, thereby making it possible to obtain a display device reduced in irregularity and having high brightness.

Further, by disposing the electronic component having the large mounting height at the upstream in the inclination direction of the platform, it is possible to dispose the platform closer to the substrate as well as to avoid constricting downsizing and thinning of the mobile terminal.

Further, this invention is characterized in that a reflection layer is provided on at least one of the platform and an inner surface of the wall part.

By reflecting light by the reflection layer provided on at least one of the platform and the inner surface of the wall part, it is possible to obtain a high-brightness display device reduced in light loss.

Also, this invention is characterized in that the reflection layer is provided by a sheet disposed on a surface of the resin part.

Since the reflection layer is provided as the sheet disposed on the surface of the resin part, it is possible to simply attach the reflection layer by readily allowing the reflection layer to follow the surface of the resin part.

Also, since reflection efficiency is improved by the reflection layer, it is possible to obtain the high-brightness display device reduced in light loss.

Further, this invention is characterized in that the reflection layer is provided on the surface of the resin part by coating.

Since the reflection efficiency is improved by providing the reflection layer by coating, it is possible to obtain the high-brightness display device reduced in light loss.

Also, by using a coating material for the reflection layer, it is possible to eliminate members used as the reflection layer, thereby enabling the reduction in number of components.

Also, this invention is characterized in that a metal plate is exposed to the surface of the shield layer.

By exposing the metal plate on the surface of the shield layer, the metal plate plays a role as a shield material and is used as the reflection layer of the display device.

With such constitution, it is possible to eliminate a reflection sheet from the display device, thereby making it possible to reduce the thickness of the mobile terminal 10 of the resin layer 94 and the number of components.

Further, this invention provides a substrate structure comprising: a substrate; a plurality of electronic components mounted along the substrate; a resin part coating the electronic components with a resin and in close contact with the substrate; and a frame surrounding the resin part, wherein the substrate structure is characterized by further comprising a component disposed on one of the resin part and the frame and characterized in that a planar outline of the component is disposed so as not to deviate from a planar outline of one the resin part and the frame.

As used herein, examples of the component disposed on the resin part or the frame include a display device (LCD), a keyboard, a touch panel, a storage cell, and the like.

Examples of a mode for disposing the component include a mode of disposing the component in such a fashion that a planar shape of the resin part or the frame and a planar shape of the component are similar to each other and that a planar rim of the resin part or the frame is exposed uniformly.

The mode of disposing the component also includes a mode of disposing the component in such a fashion that a planar shape and a planar size of the resin part or the frame and a planar shape and a planar size of the component are identical with each other, and that an end face of the resin part or the frame and an end face of the component are along an identical plane.

With such component disposition modes, damage is hardly or never caused when a load is applied on the component, thereby making it possible to improve strength as compared to the conventional examples.

Effect of the Invention

According to this invention, it is possible to achieve an effect of obtaining a shield property and a heat discharge property by providing the resin part collectively coating the plural electronic components with the reinforcing heat discharge layer and the shield layer.

Also, this invention has the effect of achieving downsizing, thinning, and a reduction in number of components of a mobile terminal by allowing a surface of the shield layer to correspond to a surface shape of another member.

Further, according to this invention, since the components is disposed in such a fashion that the planar outline of the component does not deviate from the planar outline of the resin part or the frame, damage is hardly or never caused when a load is applied on the component, thereby making it possible to improve strength as compared to the conventional examples.

Figure 1:
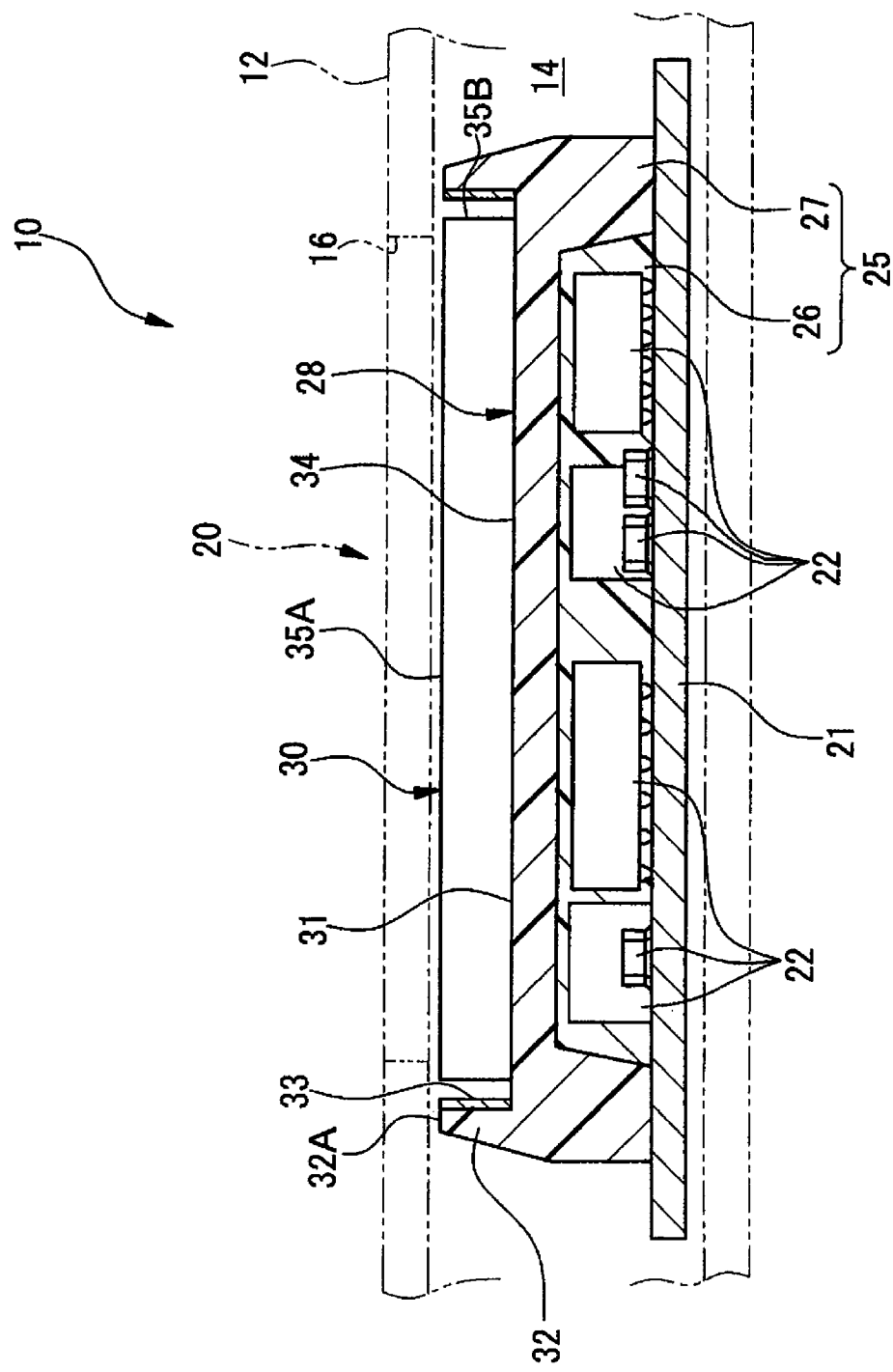
FIG. 1 is a sectional view showing a first embodiment of a substrate structure according to this invention.

DESCRIPTION OF REFERENCE NUMERALS AND SIGNS 20, 60, 70, 80, 90, 100, 110, 120: substrate structure
21: substrate
22: electronic component
25, 111, 121: resin part
26: reinforcing heat discharge layer
27: shield layer
28: surface of shield layer
30: display device (component)
31, 101: platform
32: wall part
33: reflection layer (sheet)
37A: light guiding plate inclined surface
42: light guiding part (projection of display device)
44: recessed part
71, 81: reflection layer
93A: surface
94: metal sheet (metal plate)
122: frame
H: height

BEST MODE FOR CARRYING OUT THE INVENTION

Hereinafter, substrate structures according to embodiments of this invention will be described with reference to the drawings.

First Embodiment

A mobile terminal 10 shown in FIG. 1 is provided with a substrate structure 20 according to a first embodiment that is provided in an inner space 14 of a housing 12.

Figure 2:
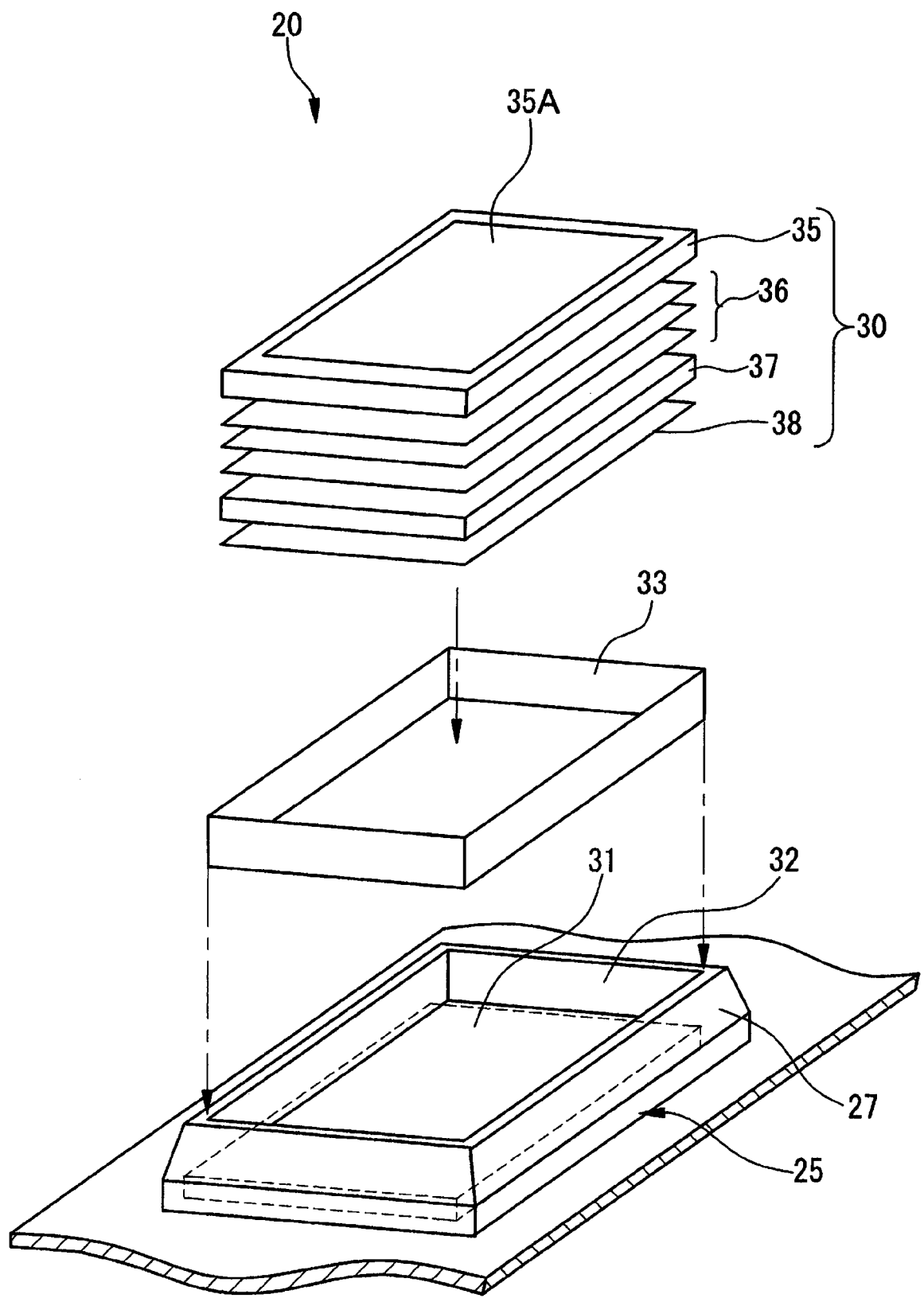
FIG. 2 is a perspective view showing the substrate structure according to the first embodiment.

As shown in FIGS. 1 and 2, the substrate structure 20 of the first embodiment is provided with a substrate 21, a plurality of electronic components 22 mounted along the substrate 21, and a resin part 25 that covers the electronic components 22 and is in close contact with the substrate 21.

The resin part 25 is provided with a reinforcing heat discharge layer 26 covering the electronic components 22 and having heat conductivity and a reinforcing property and a shield layer 27 covering the reinforcing heat discharge layer 26.

The reinforcing heat discharge layer 26 is a resin member having high heat conductivity and reinforcing property, and examples thereof include those obtainable by adding silica ($SiO_2$), alumina ($AlO_2$), silicon carbide (SiC), AlN, carbon (C), or general electroconductive fillers such as Cu, Au, AG, and Ni to an epoxy-based resin.

The shield layer 27 has a surface 28 that is formed into a predetermined shape (recessed shape) corresponding to a surface shape of a display device (another member) 30 adjacent to the resin part 25 (namely, the shield layer 27).

Specifically, the shield layer 27 has a platform 31 that is provided on the surface 28 and used for placing thereon the display device 30 and a wall part 32 provided upright around the platform 31 and surrounding the display device 30.

The platform 31 is a flat surface having a rectangular shape. The wall part 32 is a rectangular frame. The platform 31 and the wall part 32 form a recessed part 34 housing the display device 30.

The shield layer 27 is a layer formed by injecting a resin to which a metal filler is added.

The resin has a dielectric constant of 3.6, and the silica filler ($SiO_2$) serving as the metal filler has a dielectric constant of 3 or less.

The silica filler having an average particle diameter of 8 μm or more and a maximum particle diameter of 40 μm or less may preferably be used.

As described above, since the resin part 25 is provided with the reinforcing heat discharge layer 26 covering the electronic components 22 and the shield layer 27 covering the reinforcing heat discharge layer 26, a heat discharge property and a shield property for the electronic components are achieved.

The surface 28 of the shield layer 27 has the predetermined shape corresponding to the surface shape of the display device 30. Therefore, it is possible to omit a support member, for example, that is used in the conventional examples, and, by forming the recessed part as required, it is possible to support the display device 30 in such a fashion that the display device is recessed as compared to the conventional examples.

Thus, it is possible achieve downsizing, thinning, and reduction in number of components of the mobile terminal 10.

Further, the recessed part 34 is formed by providing the platform 31 on the surface of the shield layer 27 and providing the wall part 32 upright around the platform 31.

By housing the display device 30 in the recessed part 34, it is possible to support and protect the display device 30 by the shield layer 27.

On an inner surface of the wall part 32 (i.e. on the surface 28 of the resin part), a reflection layer 33 is provided by adhesion.

The reflection layer 33 is a white or silver sheet, for example, and is a frame-like sheet (or a sheet) having the shape of a rectangular frame. By using the white or silver sheet as the reflection layer 33, it is possible to increase reflection efficiency.

Since the reflection efficiency is increased by the reflection layer 33 as described above, it is possible to obtain a high-brightness display device reduced in light loss.

Also, since the reflection layer 33 is the frame-like sheet, it is possible to simply attach the reflection layer by readily allowing the reflection layer 33 to follow the surface of the resin part 25.

An LCD or the like may be used as the display device 30, and the display device 30 is disposed in such a fashion that a display surface 35A faces to an opening of the housing 12 and that an end face 35B faces to the reflection layer 33.

Also, a lower surface, i.e. a reflection sheet 38, of the display device 30 is placed on the platform 31.

Figure 3:
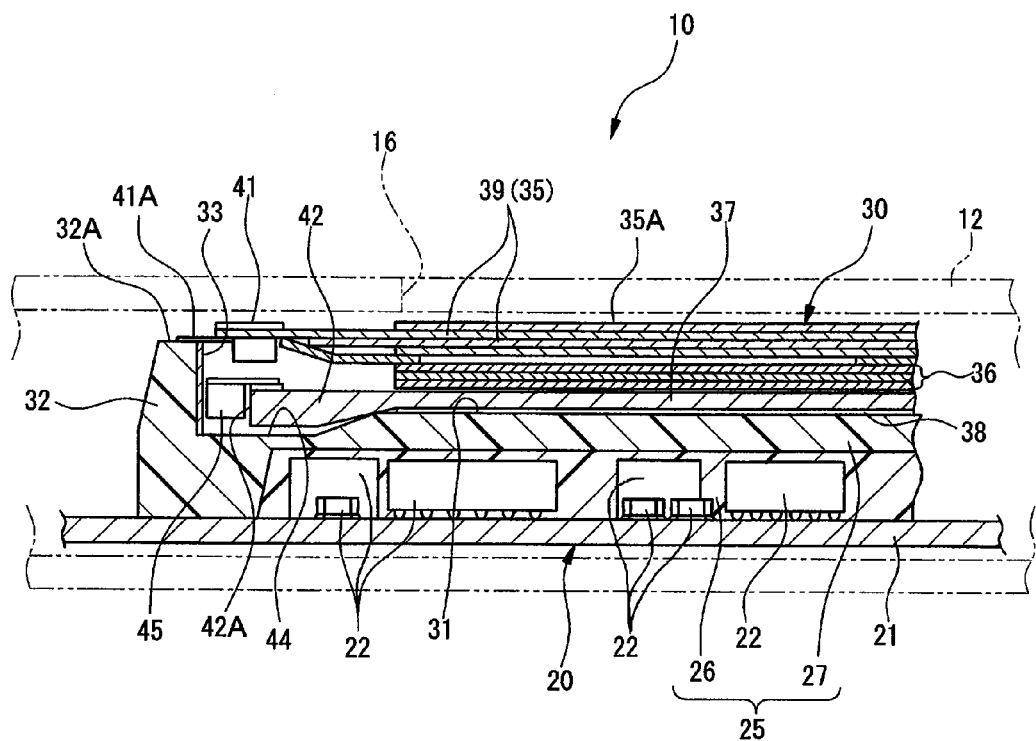
FIG. 3 is an enlarged view showing a main part of the substrate structure according to the first embodiment.

As shown in FIGS. 2 and 3, the display device 30 is obtained by laminating an optical sheet 36 on a lower surface of a main body 35, laminating a light guiding plate 37 on a lower surface of the optical sheet 36, and laminating the reflection sheet 38 on a lower surface of the light guiding plate 37.

As shown in FIG. 35, the main body 35 is obtained by providing a liquid crystal part (not shown) between a pair of transparent substrates 39.

An electroconductive part 41 is provided on the transparent substrates 39, and a terminal 41A of the electroconductive part 41 is in contact with a top part 32A of the wall 32.

A light guiding part (projection) 42 having a substantially wedge-like shape is formed at one end face of the light guiding plate 37. A light source (LED) 45 is so provided as to face the end face of the light guiding part 42.

Since the light guiding part 42 has the substantially wedge-like shape, the light guiding part 42 is projected toward a lower part of the light guiding plate 37.

In order to prevent interference of the light guiding plate 42 and the light source 45 with the platform 31, a recessed part 44 corresponding to the light guiding part 42 and the light source 45 is provided at a part of the platform 31 facing to the light guiding part 42 and the light source 45.

Therefore, it is possible to house the light guiding part 42 and the light source 45 in the recessed part 44. With such constitution, it is possible to place the display device 30 on the platform 31 in a state where the reflection sheet 38 of the display device 30 is in contact with the platform 31 while preventing the display device 30 from floating up from the platform 31 of the shield layer 27.

Hereinafter, a process for producing the substrate structure 20 of the first embodiment will be described based on FIGS. 4 to 6.

Figure 4:
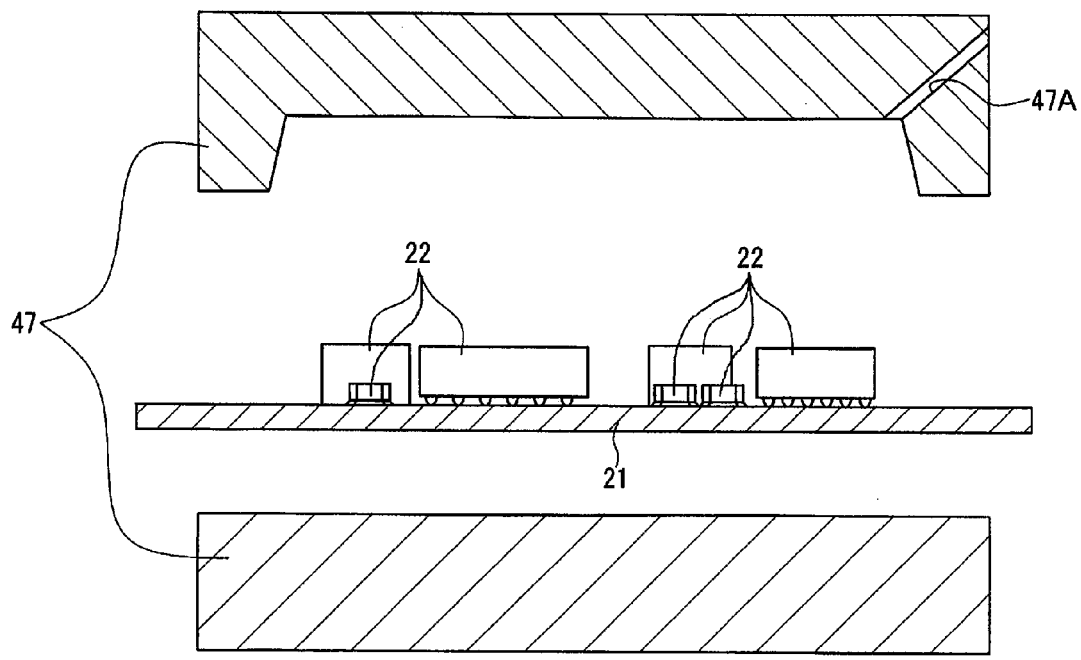
FIG. 4 is a diagram for illustrating one example of molding a first die in a production process of the substrate structure according to the first embodiment.

As shown in FIG. 4, after mounting the plural electronic components 22 on the substrate 21, a first die 47 is molded.

Figure 5:
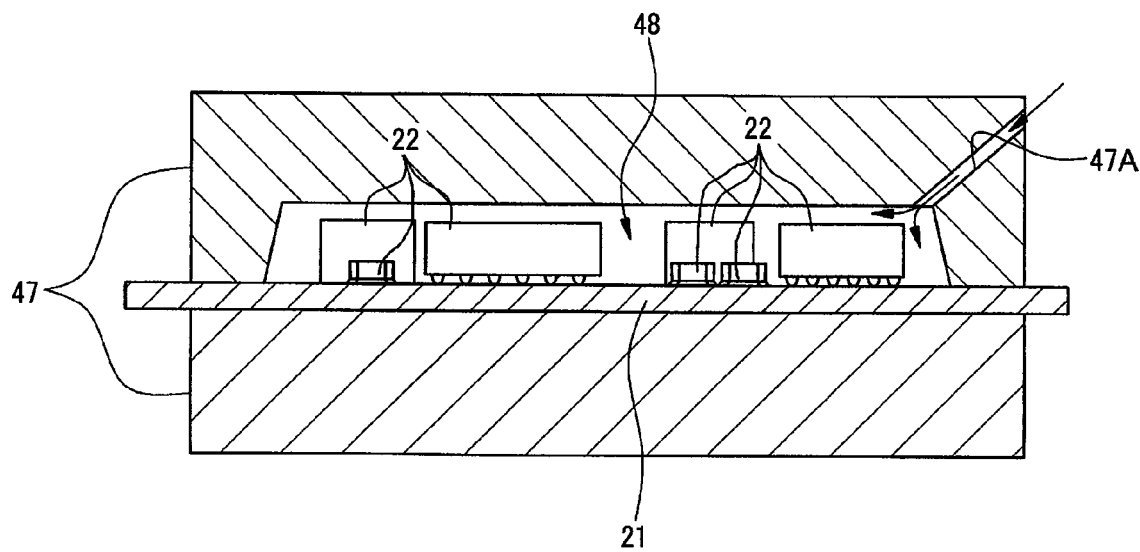
FIG. 5 is a diagram for illustrating one example of injection-molding a reinforcing heat discharge layer in a production process of the substrate structure according to the first embodiment.

As shown in FIG. 5, by molding the first die 47 a first cavity space 48 is formed.

After molding the first die 47, a melted resin for the reinforcing heat discharge layer 26 shown in FIG. 1 is injected into the first cavity space 48 from a gate 47A. The melted resin contains a filler for ensuring the heat discharge property and the reinforcing property.

When the melted resin injected into the first cavity space 48 is solidified, the reinforcing heat discharge layer 26 is obtained.

After the solidification of the melted resin, the first die 47 is opened.

Figure 6:
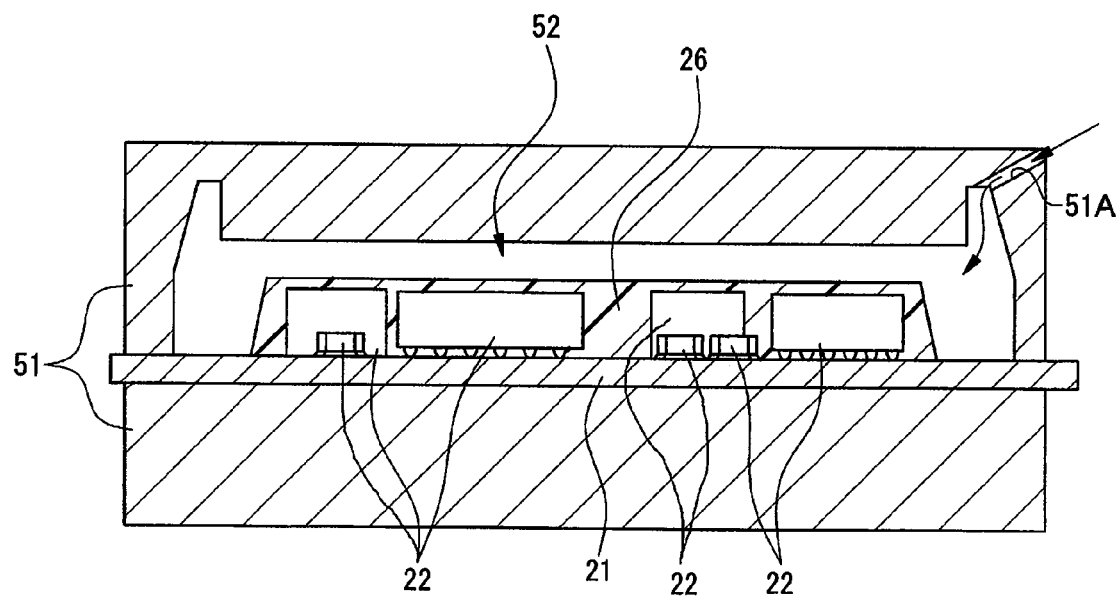
FIG. 6 is a diagram for illustrating one example of injection-molding a shield layer in a production process of the substrate structure according to the first embodiment.

As shown in FIG. 6, by molding a second die 51, a second cavity space 52 is formed.

After molding the second die 51, a melted resin for the shield layer 27 shown in FIG. 1 is injected into the second cavity space 52 from a gate 51A. The melted resin contains a metal filler.

When the melted resin injected into the second cavity space 52 is solidified, the shield layer 27 is obtained.

After the solidification of the melted resin, the second die 51 is opened. After opening the second die 51, the reflection layer 33 that is the frame-like sheet is attached along the inner surface of the wall part 32 as shown in FIG. 2.

After attaching the reflection layer 33, the display device 30 is housed in the recessed part 34 of the shield layer 27. When the reflection sheet 38 of the display device 30 is placed on the platform 31, the end face 35 of the display device 30 faces to the reflection layer 33.

Thus, the production process of the substrate structure 20 is completed.

Though the example of attaching the reflection layer 33 to the inner surface of the wall part 32 is described in the first embodiment, it is possible to form the reflecting layer 33 by inserting the reflection layer 33 into the wall part 32 without limitation to the above-described example. In this case, the reflection layer 33 may preferably be exposed from the inner surface of the wall part 32.

Also, though the example of molding the reinforcing heat discharge layer 26 and the shield layer 27 by the injection molding is described in the first embodiment, it s possible to mold the layers by transfer molding, liquid molding, dispensing, potting, or the like without limitation to the above-described example.

Further, it is not always necessary to form the reinforcing heat discharge layer 26 and the shield layer 27, and it is possible to form the layers by different molding methods.

Hereinafter, second to eighth embodiments will be described based on FIGS. 7 to 18. In the second to eighth embodiments, components that are the same or similar to those of the substrate structure 20 of the first embodiment are denoted by the same reference numerals, and description thereof is omitted.

Second Embodiment

Figure 7:
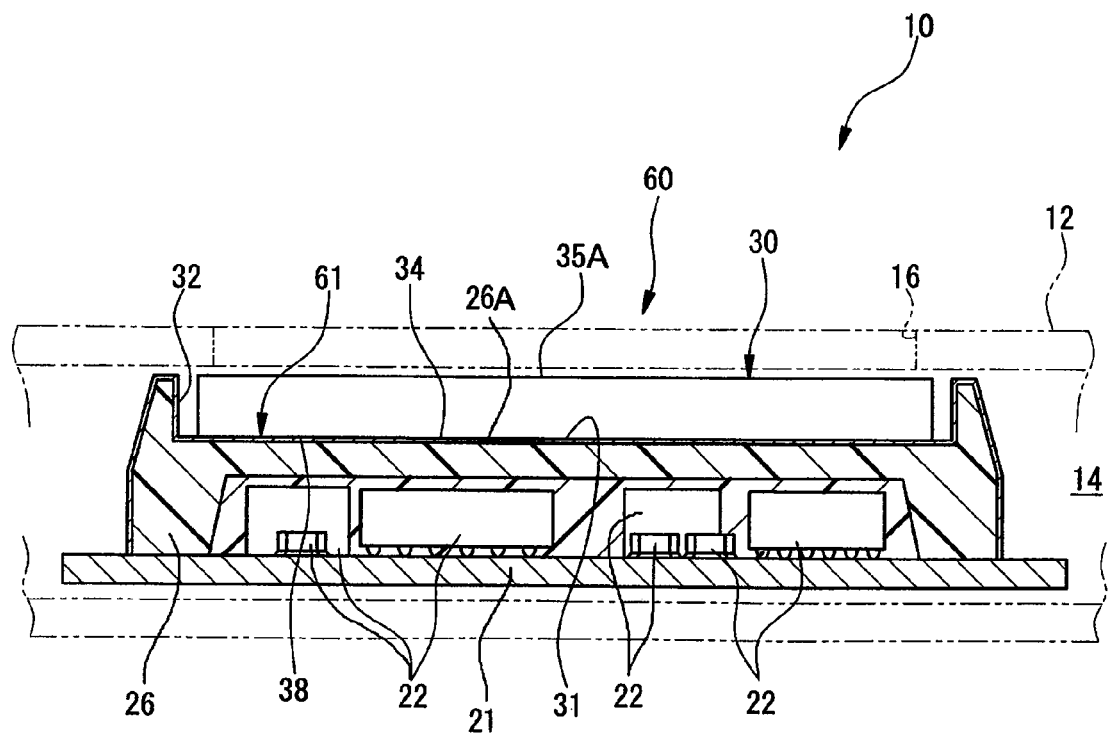
FIG. 7 is a sectional view showing a second embodiment of a substrate structure according to this invention.

In a substrate structure 60 of the second embodiment shown in FIG. 7, the shield layer 27 of the first embodiment is replaced with a shield layer 61, and other parts of the structure are the same as those of the substrate structure 20 of the first embodiment.

The shield layer 61 is obtained by attaching a wiring sheet to a surface 26A of the reinforcing heat discharge layer 26.

The wiring sheet means the one obtained by wiring a plurality of linear conductors on a soft film, the one obtained by printing a linear conductor by meandering wiring, or the like.

The conductor is provided for ensuring the shielding property.

By using the wiring sheet as the shield layer 61, it is possible to reduce a thickness of the shield layer 61. Thus, it is possible to achieve further thinning of the substrate structure 60.

Hereinafter, a process for producing the substrate structure 60 of the second embodiment will be described based on FIGS. 8 and 9.

Figure 8:
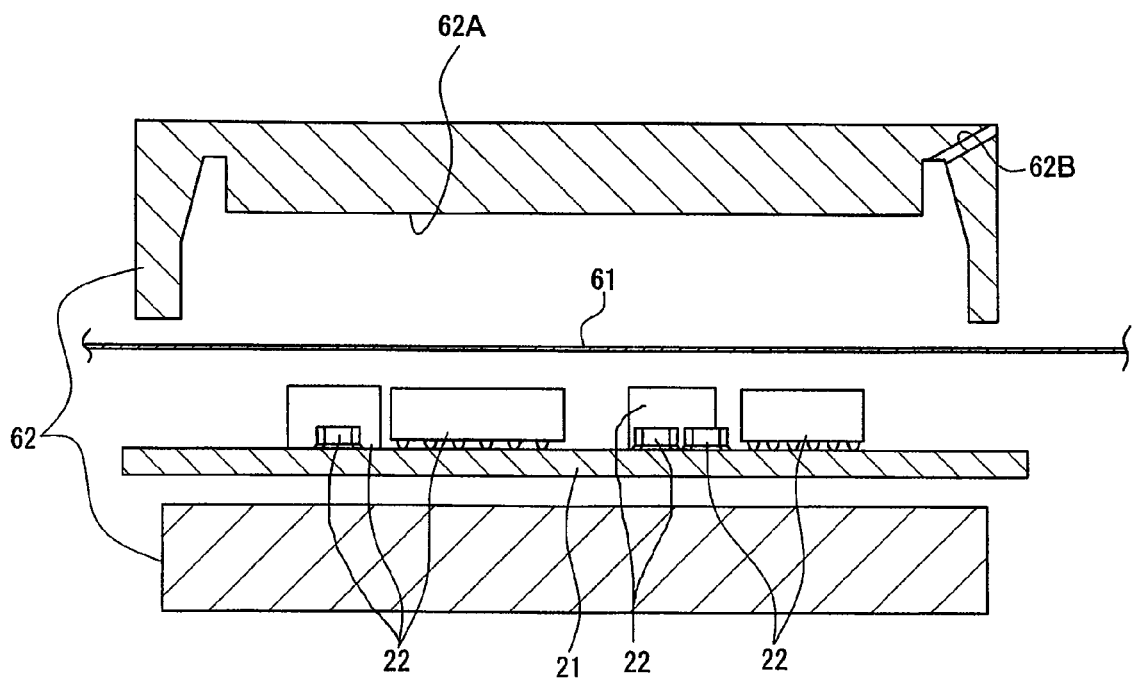
FIG. 8 is a diagram for illustrating one example of disposing a shield layer between a die and electronic components in a production process of the substrate structure according to the second embodiment.

As shown in FIG. 8, after mounting the plural electronic components 22 on the substrate 21, the shield layer 61 is disposed between a die 62 and the electronic components 22.

The shield layer 61 is disposed in such a manner that the shield layer 26 in the form of a roll is drawn to be placed between the die 62 and the electronic components 22.

Figure 9:
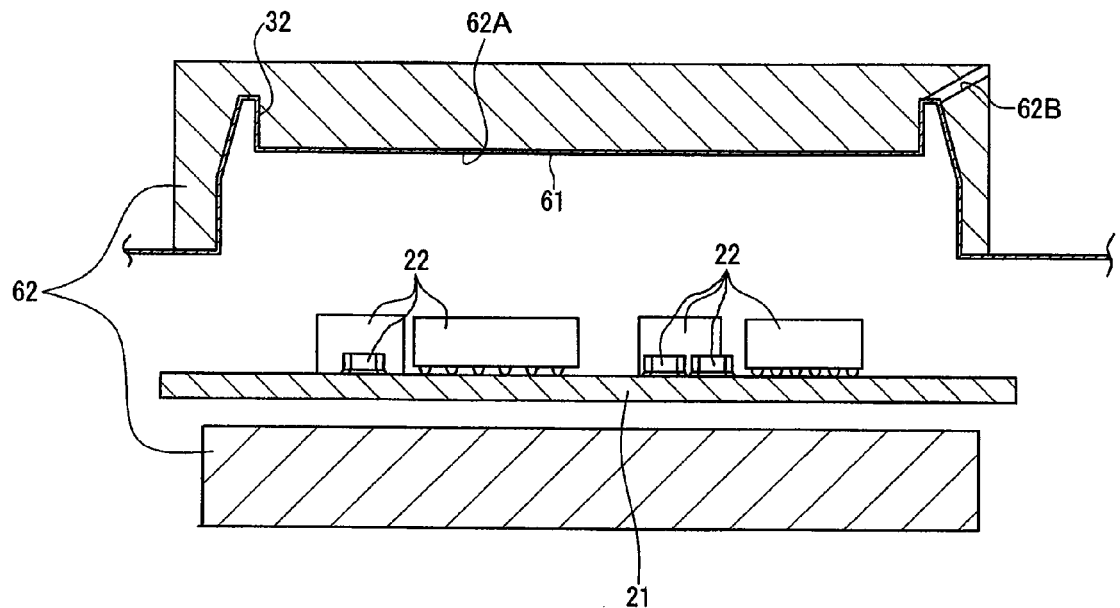
FIG. 9 is a diagram for illustrating one example of adhering the shield layer to the die in the production process of the substrate structure according to the second embodiment.

As shown in FIG. 9, the shield layer 61 is attached to a molded surface 62A of the die 62 by vacuum contact, for example.

In this state, the die is molded.

By molding the die 62, a cavity space (not shown) is formed.

After molding the die 62, a melded resin for the reinforcing heat discharge layer 26 shown in FIG. 7 is injected inside the cavity space from the gate 62B. The melted resin contains a filler for ensuring heat conductivity and a reinforcing property.

When the melted resin injected into the cavity space is solidified, the reinforcing heat discharge layer 26 shown in FIG. 7 is obtained.

After the solidification of the melted resin, the die 62 is opened.

By using the wiring sheet as the shield layer 61 as described above, it is unnecessary to inject-mold the shield layer 61. Therefore, an equipment cost is suppressed since the use of only one set of the die 62 is sufficient.

After opening the die 62, the reflection layer 33 shown in FIG. 2 is attached along the inner surface of the wall part 32.

After attaching the reflection layer 33, the display device 30 is housed in the recessed part 34 of the shield layer 61. When the reflection sheet 38 of the display device 30 is placed on the platform 31, the end face 35 of the display device 30 faces to the reflection layer 33 or the wall part 32.

Thus, the production process of the substrate structure 60 is completed.

According to the substrate structure 60 of the second embodiment, it is possible to reduce the number of the die 62 and to reduce the thickness of the substrate structure 60 by using the wiring sheet as the shield layer 61.

Further, according to the substrate structure 60 of the second embodiment, it is possible to achieve the same effects as the substrate structure 20 of the first embodiment.

Though the example of using the wiring sheet as the shield layer 61 is described in the second embodiment, the same effect is achieved by using a metal sheet without limitation to the above-described example.

Third Embodiment

Figure 10:
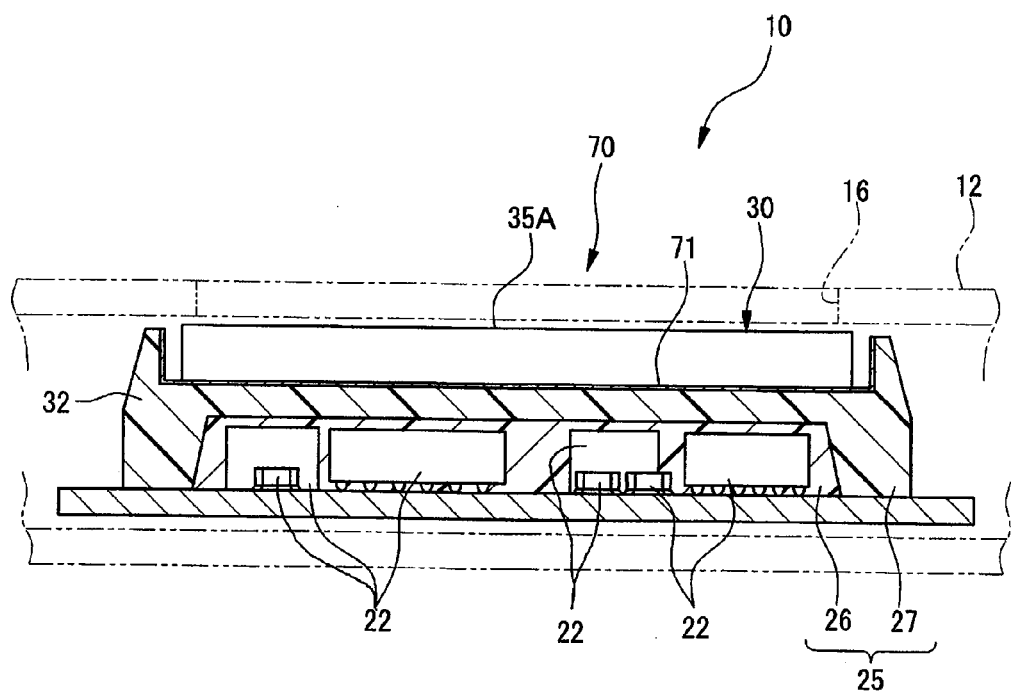
FIG. 10 is a sectional view showing a third embodiment of a substrate structure according to this invention.
Figure 11:
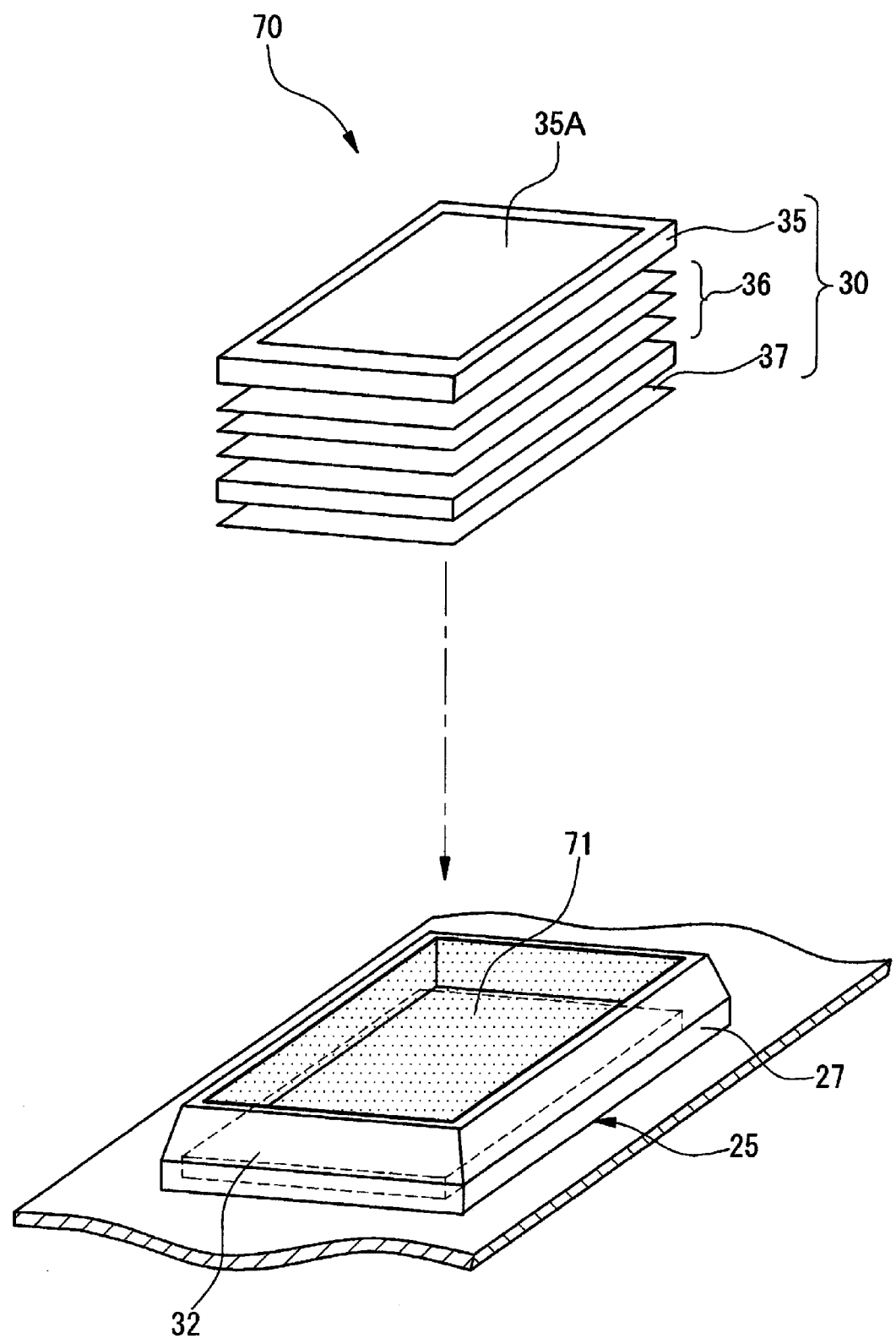
FIG. 11 is an exploded perspective view showing the substrate structure according to the third embodiment.

A substrate structure 70 of the third embodiment shown in FIGS. 10 and 11 is provided with a reflection layer 71 obtained by coating a white or silver coating matter, for example, on the inner surface of the wall part 32, and other parts of the structure are the same as those of the substrate structure 20 of the first embodiment.

By coating the white or silver coating matter as the reflection layer 71, reflection efficiency is improved. Since the reflection efficiency is improved by of the reflection layer 71 as described above, it is possible to obtain a high-brightness display device reduced in light loss.

In addition, since coating matters in general have various colors, it is possible to select a color among the various colors.

According to the substrate structure 70 of the third embodiment, by using the coating matter as the reflection layer 71, it is possible to reduce the number of components since it is unnecessary to use the frame-like sheet as the reflection layer 33 as in the first embodiment.

Further, according to the substrate structure 70 of the third embodiment, it is possible to achieve the same effects as the substrate structure 20 of the first embodiment.

Fourth Embodiment

Figure 12:
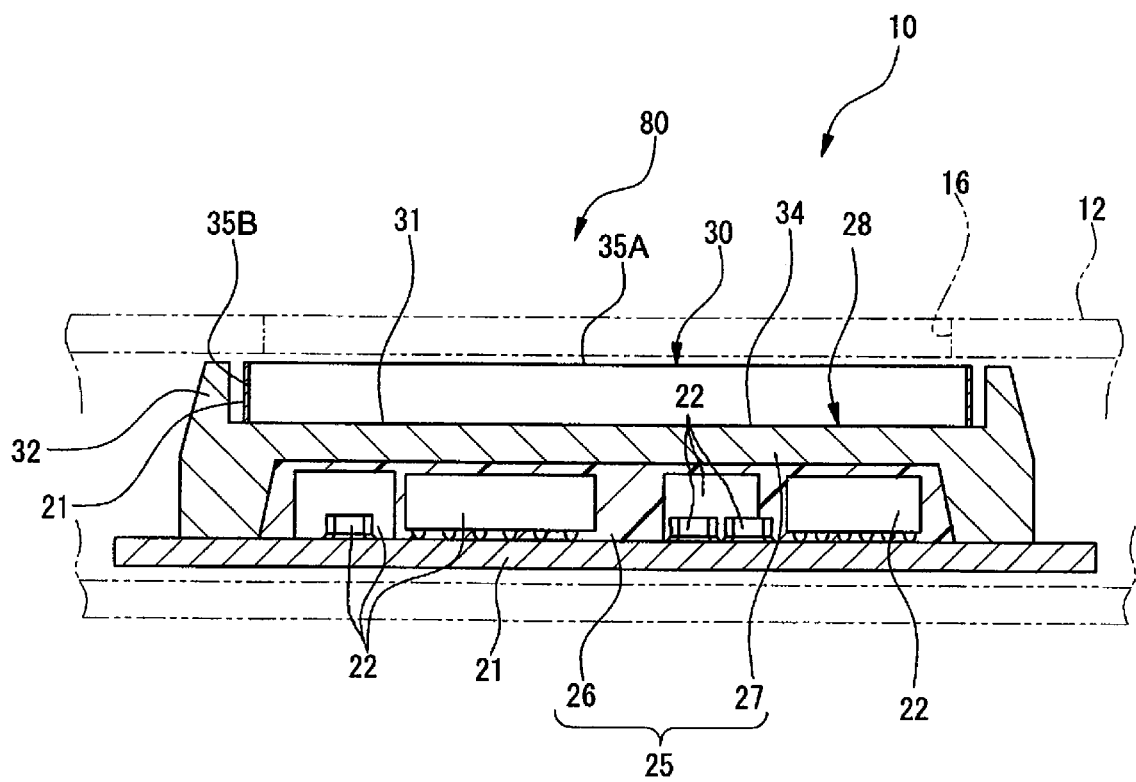
FIG. 12 is a sectional view showing a fourth embodiment of a substrate structure according to this invention.
Figure 13:
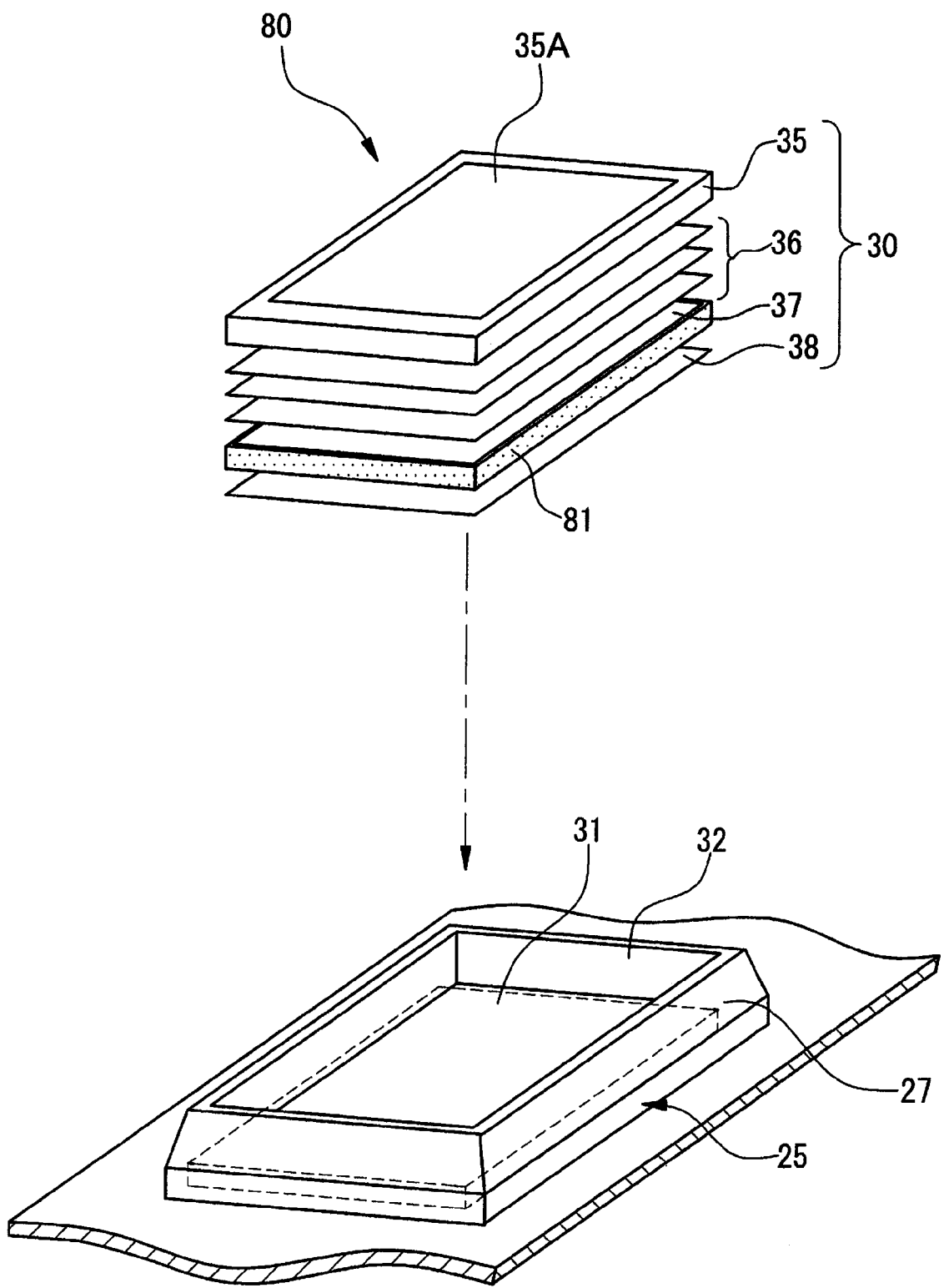
FIG. 13 is an exploded perspective view showing the substrate structure according to the fourth embodiment.

A substrate structure 80 of the fourth embodiment shown in FIGS. 12 and 13 is provided with a reflection layer 81 obtained by coating a white or silver coating matter, for example, on the end face of the display device 30, and other parts of the structure are the same as those of the substrate structure 20 of the first embodiment.

By coating the white or silver coating matter as the reflection layer 81, reflection efficiency is improved. Since the reflection efficiency is improved by the reflection layer 81 as described above, it is possible to obtain a high-brightness display device reduced in light loss.

In addition, since coating matters in general have various colors, it is possible to select a color among the various colors.

According to the substrate structure 80 of the fourth embodiment, by using the coating matter as the reflection layer 81, it is possible to reduce the number of components since it is unnecessary to use the frame-like sheet as the reflection layer 33 as in the first embodiment.

Also, by providing the reflection layer 81 on the end face 35B of the display device 30, it is possible to coat the display device 30 before incorporating the display device 30 into the recessed part 34 of the shield layer 27.

Further, according to the substrate structure 70 of the third embodiment, it is possible to achieve the same effects as the substrate structure 20 of the first embodiment.

Fifth Embodiment

Figure 14:
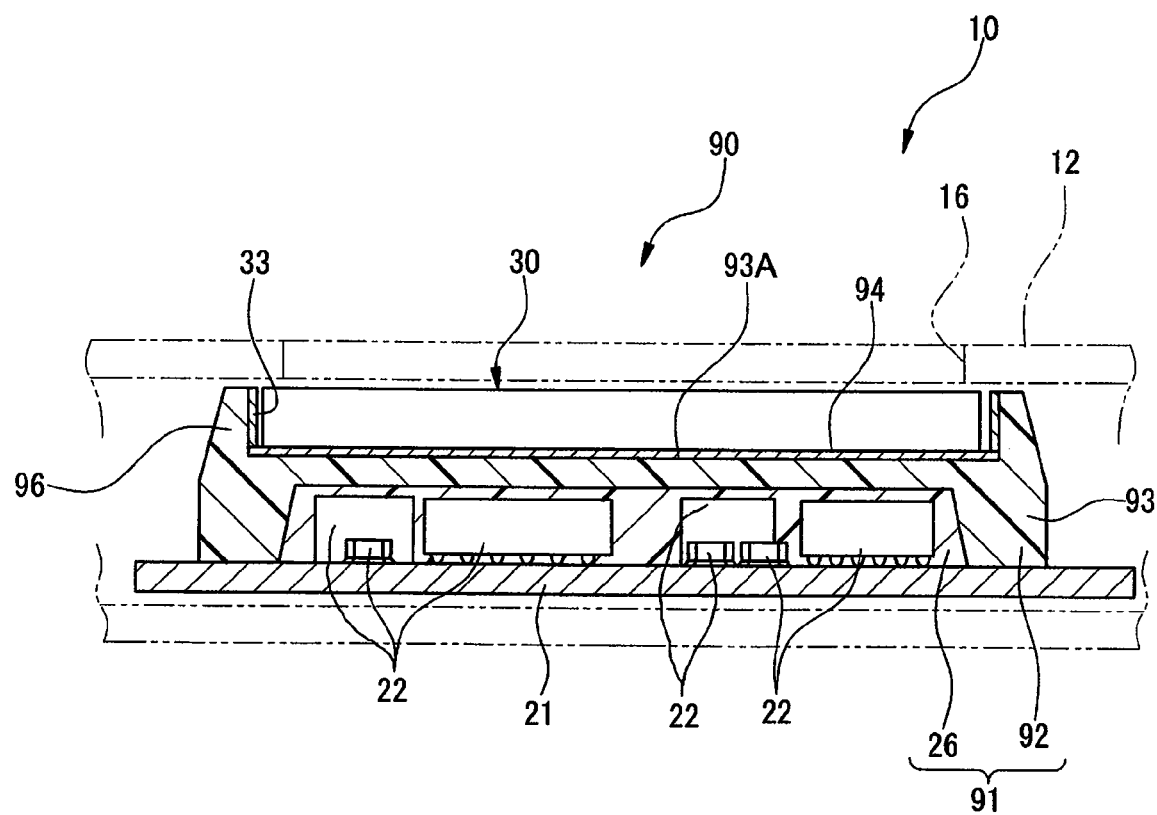
FIG. 14 is a sectional view showing a fifth embodiment of a substrate structure according to this invention.

The mobile terminal 10 shown in FIG. 14 has a substrate structure 90 of the fifth embodiment in the inner space 14 of the housing 12.

Figure 15:
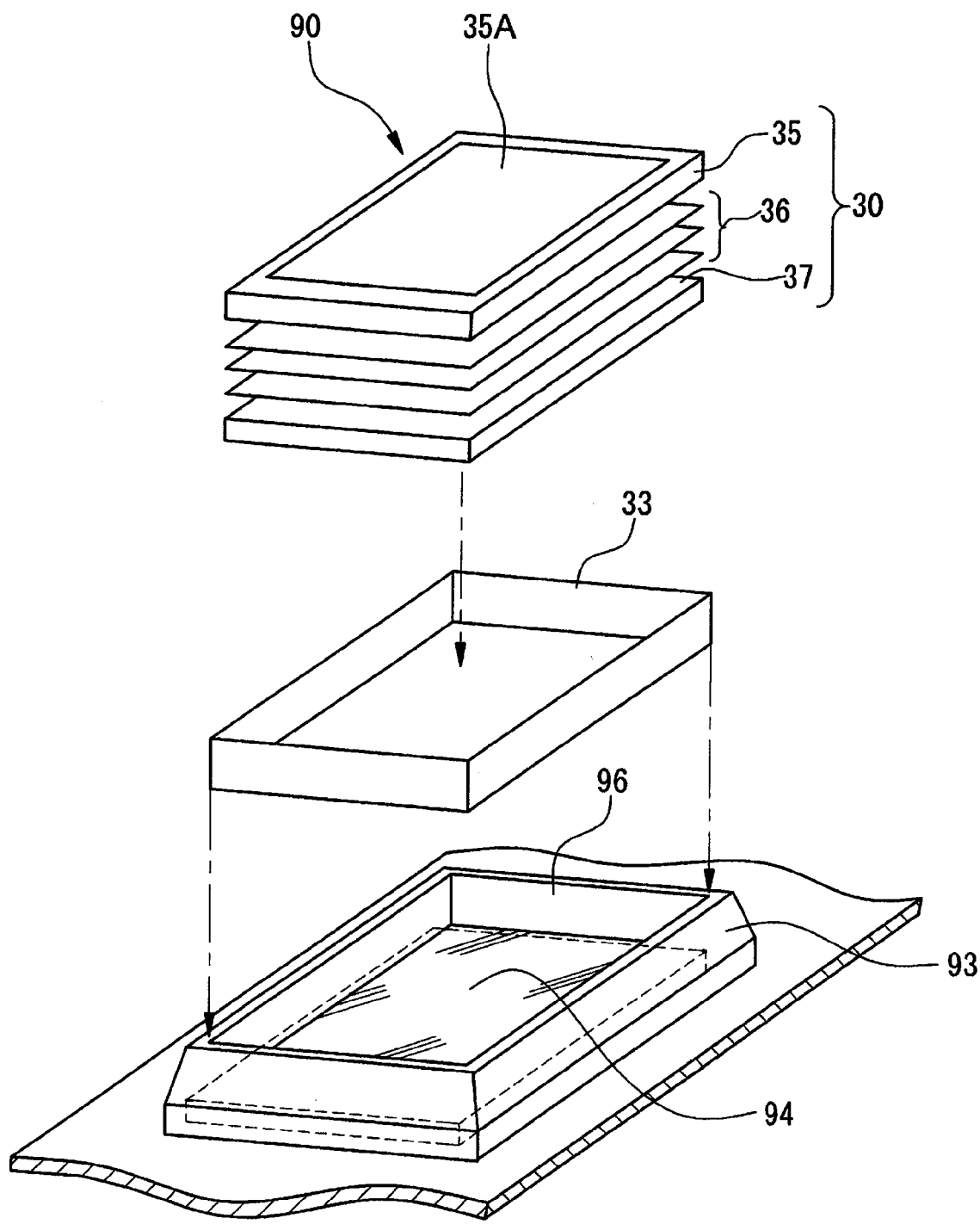
FIG. 15 is an exploded perspective view showing the substrate structure according to the fifth embodiment.

As shown in FIGS. 14 and 15, the substrate structure 90 of the fifth embodiment is provided with the substrate 21, the plurality of electronic components 22 mounted along the substrate 21, and a resin part 91 covering the electronic components 22 and in close contact with the substrate 21.

The resin part 91 is provided with a reinforcing heat discharge layer 26 covering the electronic components 22 and having heat conductivity and a reinforcing property and a shield layer 92 covering the reinforcing heat discharge layer 26.

That is, in the substrate structure 90 of the fifth embodiment, the shield layer 92 is replaced with the shield layer 27 of the first embodiment, and other parts of the structure are the same as those of the first embodiment.

The shield layer 92 is obtained by inserting a metal sheet (metal plate) 94 into a resin layer 93 to ensure the shielding property.

Since the metal sheet 94 is used as the shield material in the substrate structure 90 of the fifth embodiment, it is unnecessary to add a metal filler as in the shield layer 27 (see FIG. 1) of the first embodiment.

Therefore, the resin to be used for injection-molding the shield layer 92 is more easily obtained.

The metal sheet 94 is exposed to a surface 93A of the resin layer 93.

By exposing the metal sheet 94 to the surface of 93A of the resin layer 93, a platform for placing thereon the display device 30 is formed by the metal sheet 94.

Further, the metal sheet is used also as a reflection layer of the display device 30.

Therefore, it is possible to eliminate the reflection sheet 38 from the display device 30 of the first embodiment, and it is possible to achieve the thinning and the reduction in number of components of the mobile terminal 10 of the reins layer 94.

The reflection layer 33 is provided on the inner surface of a wall part 96 of the resin layer 94 as in the first embodiment.

According to the substrate structure 90 of the fifth embodiment, it is possible to achieve the thinning and the reduction in number of components of the mobile terminal 10 by inserting the metal sheet 94 into the shield layer 92.

Further, according to the substrate structure 90 of the fifth embodiment, it is possible to achieve the same effects as the substrate structure 20 of the first embodiment.

Though the example of exposing the metal sheet 94 to the surface 93A of the resin layer 93 is described in the fifth embodiment, it is possible to embed the metal sheet 94 into the inner part of the resin layer 93.

In this case, it is necessary to provide the reflection sheet 38 on the display device 30.

Alternatively, a wiring sheet may be used in place of the metal sheet 94. This wiring sheet is the same as that used in the second embodiment.

The wiring sheet means the one obtained by wiring a plurality of linear conductors on a soft film, the one obtained by printing a linear conductor by meandering wiring, or the like.

The conductor is provided for ensuring the shielding property.

Sixth Embodiment

Figure 16:
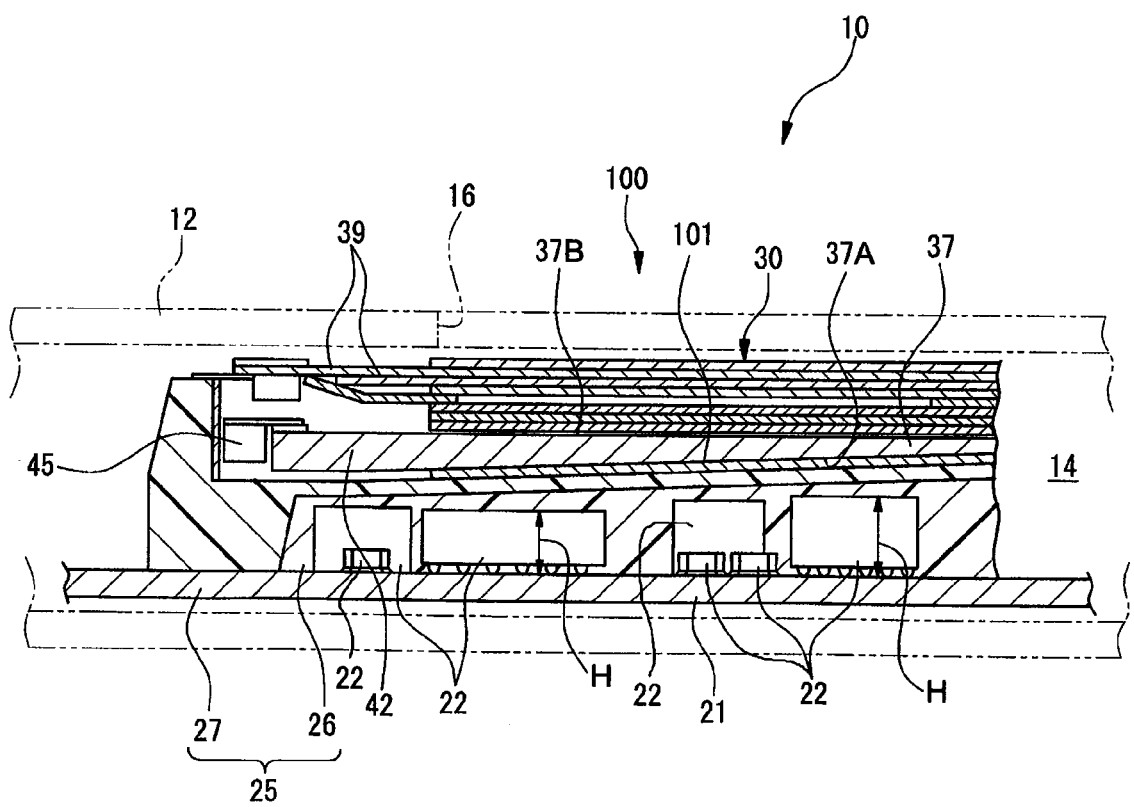
FIG. 16 is an enlarged view showing a main part of a sixth embodiment of a substrate structure according to this invention.
Figure 17:
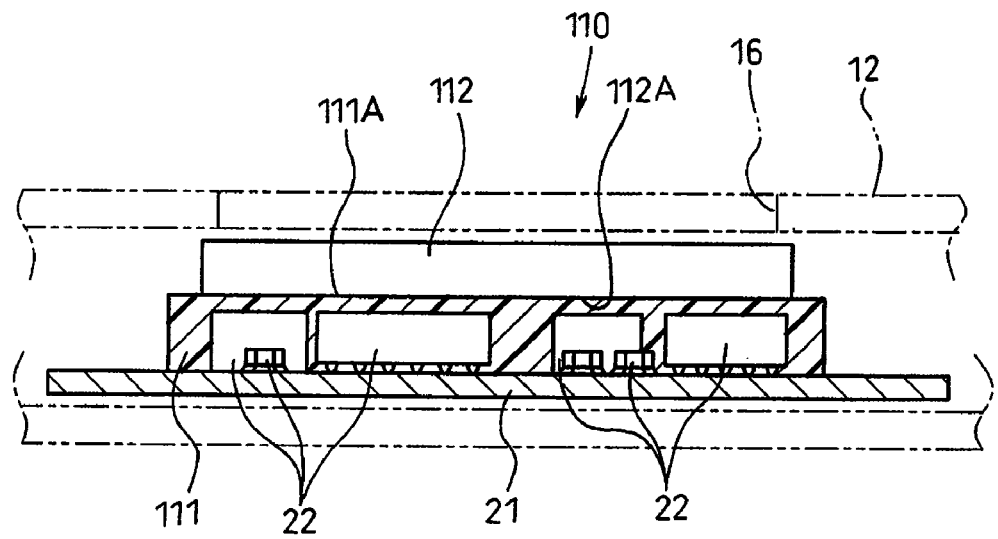
FIG. 17(A) is a sectional view showing a seventh embodiment of a substrate structure according to this invention.
FIG. 17(B) is an exploded perspective view showing the substrate structure according to the seventh embodiment of this invention.
Figure 17:
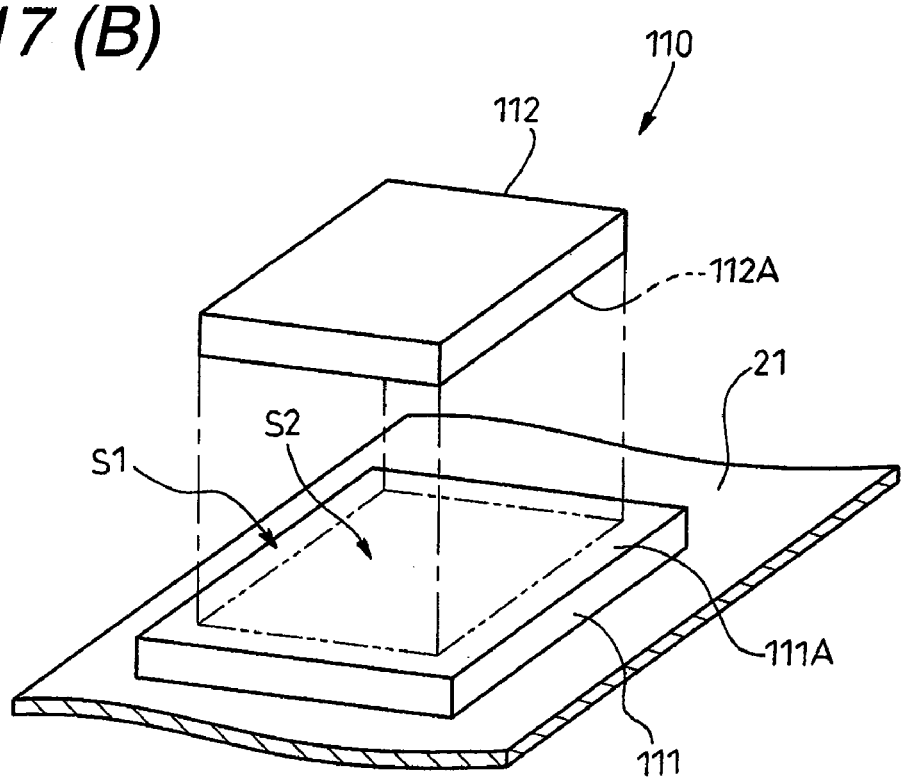
Figure 18:
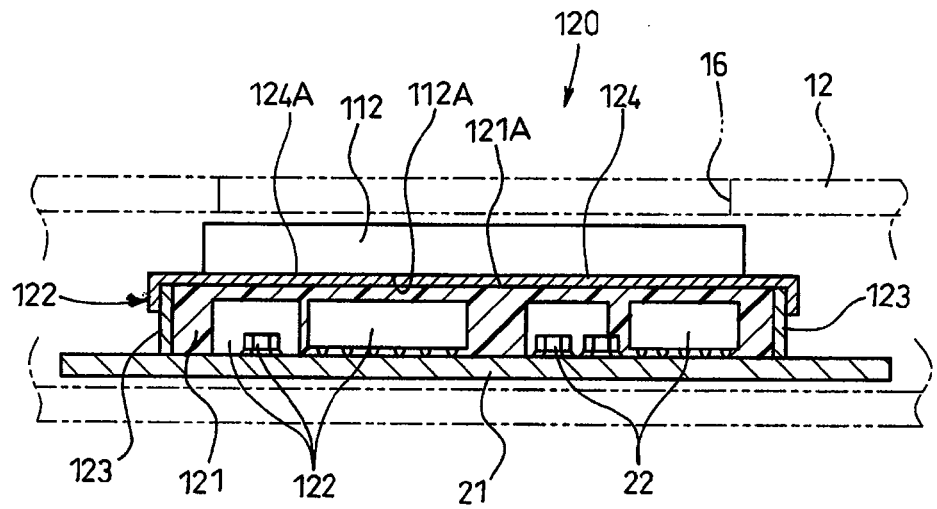
FIG. 18(A) is a sectional view showing an eighth embodiment of a substrate structure according to this invention.
FIG. 18(B) is an exploded perspective view showing the substrate structure according to the eighth embodiment of this invention.
Figure 18:
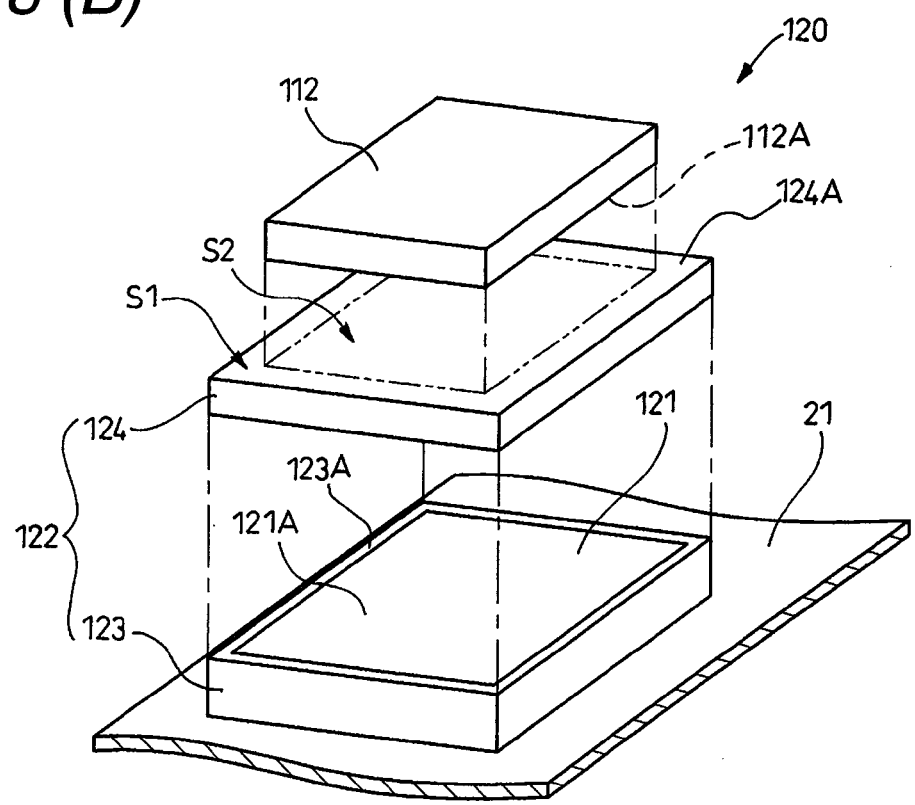
Figure 19:
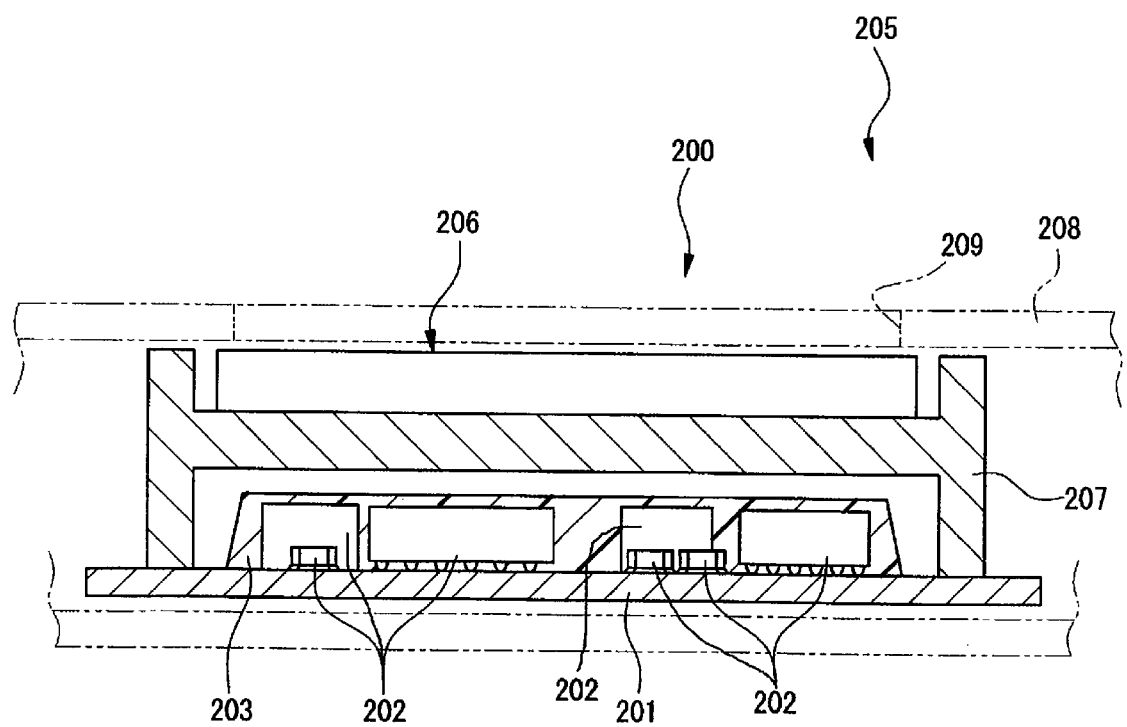
FIG. 19 is a sectional view showing a conventional substrate structure.
Figure 20:
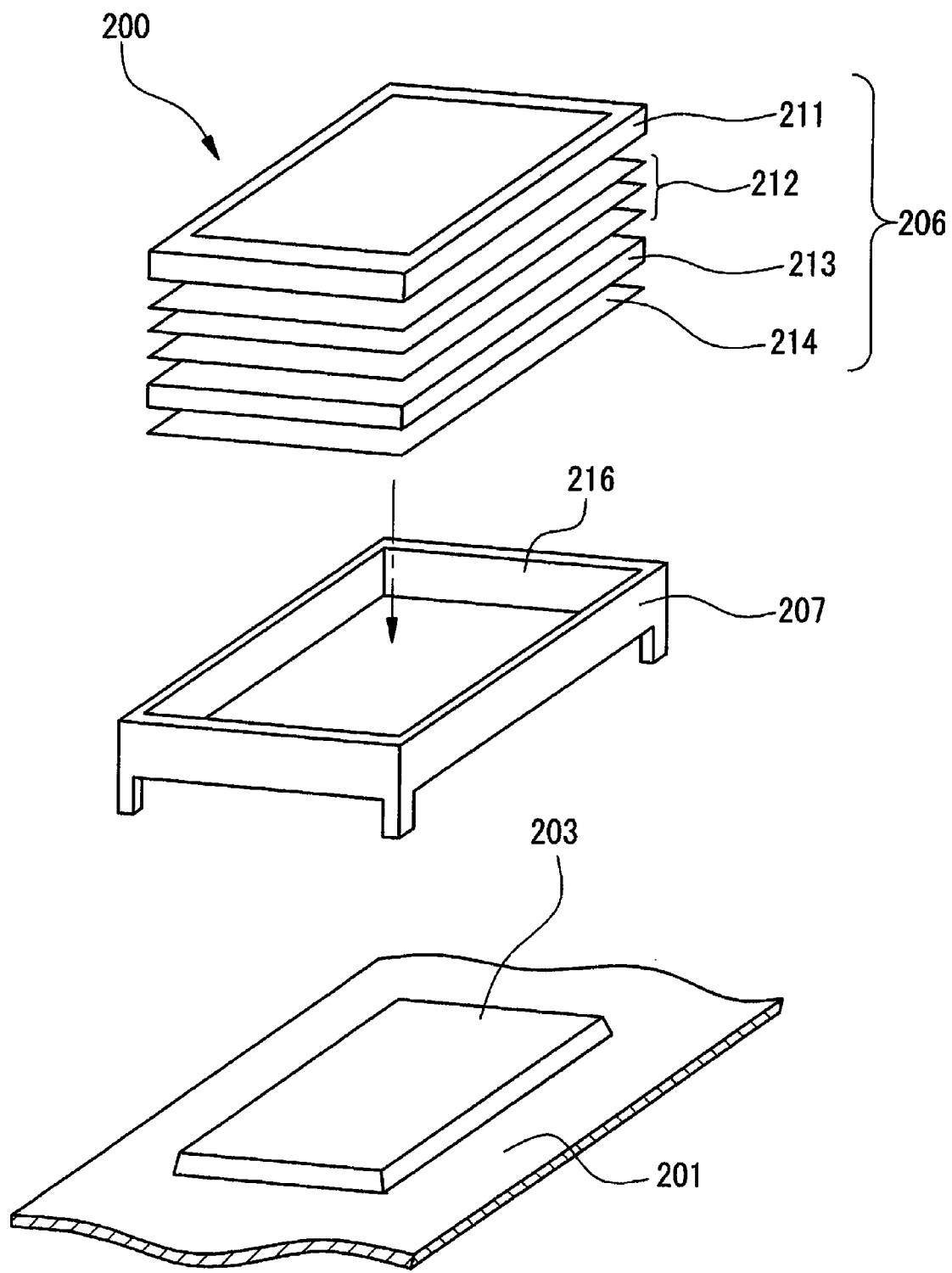
FIG. 20 is an exploded perspective view showing the conventional substrate structure.
Figure 21:
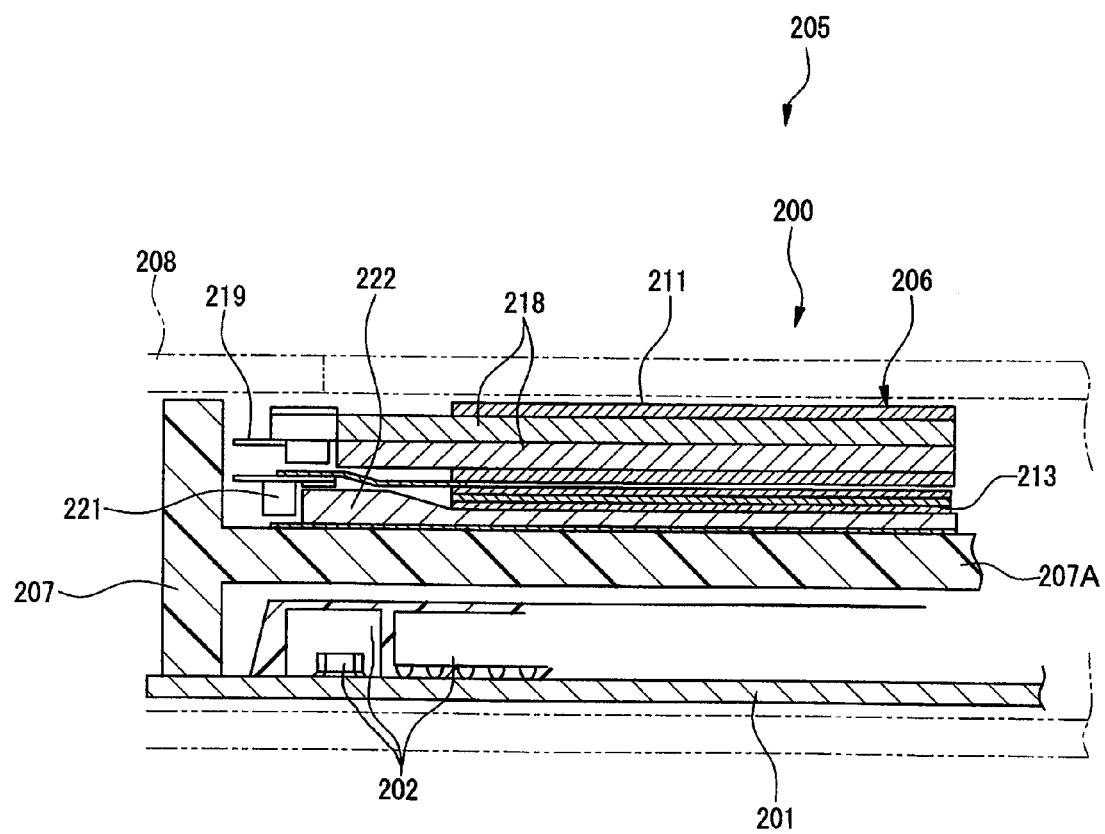
FIG. 21 is an enlarged view showing a main part of the conventional substrate structure.

In a substrate structure 100 of the sixth embodiment shown in FIG. 16, a platform 101 serves as an inclined surface 37A of the light guiding plate 37 of the display device 30, and electronic components 22 having a large mounting height among the electronic components 22 are disposed at an upstream of an inclination direction of the platform 101. Other parts of the structure are the same as those of the substrate structure 20 of the first embodiment.

According to the substrate structure 100 of the sixth embodiment, by forming the platform 101 as the inclined surface 37A of the light guiding plate 37 of the display device 30, it is possible to reflect light made incident from an end face 42A of the light guiding part 42 provided on the light guiding plate 37 by the inclined surface 37A to cause the light to uniformly exit from a surface 37B of the light guiding plate 37, thereby obtaining a high-brightness display device reduced in irregularity.

According to the substrate structure 100 of the sixth embodiment, since the electronic components 22 having a large mounting height among the electronic components 22 are disposed at an upstream of an inclination direction of the platform 01, it is possible dispose the platform 101 closer to the substrate 21 as well as to avoid constricting downsizing and thinning of the mobile terminal 10.

Further, according to the substrate structure 100 of the sixth embodiment, it is possible to achieve the same effects as the substrate structure 20 of the first embodiment.

Seventh Embodiment

As shown in FIGS. 17(A) and 17(B), a substrate structure 110 of the seventh embodiment is provided with the substrate 21, the plurality of electronic components 22 mounted along the substrate 21, and a resin part 111 covering the electronic components 22 and in close contact with the substrate 21.

The resin part 111 is a resin member having high heat conductivity and reinforcing property, and examples thereof include those obtainable by adding silica ($SiO_2$), alumina ($AlO_2$), silicon carbide (SiC), AlN, carbon (C), or general electro-conductive fillers such as Cu, Au, AG, and Ni to an epoxy-based resin.

In the substrate structure 110, the display device 30 that is one of the components is deposed on the resin part 111.

Specifically, the resin part 111 has an upper surface 111A having a rectangular shape having an area S1. The display device 30 has a lower surface 30A having a rectangular shape having an area S2. A relationship between the area S1 and the area S2 is S1>S2.

By disposing the lower surface 30A of the display device 30 at substantially the center of the upper surface 111A, a planar outline of the display device 30 is prevented from deviating from a planar outline of the resin part 111.

Since the display device 30 which is the component disposed on the resin part 111 is disposed in such a fashion that the planar outline of the display device 30 is prevented from deviating from the planar outline of the resin part 111, damage is hardly or never caused on the display device 30, resin part 111, and the like when a load is applied on the display device 30, thereby making it possible to improve strength as compared to the conventional examples.

When the lower surface 30A of the display device 30 is shifted from the upper surface 11A by a certain degree, it is possible to achieve the same effect by establishing a state in which the planar outline of the display device 30 does not deviate from the planar outline of the resin part 111 by disposing the end face of the resin part 111 and the end face of the display device 30 along an identical plane.

Eighth Embodiment

As shown in FIGS. 18(A) and 18(B), a substrate structure 120 of the eighth embodiment is provided with the substrate 21, the plurality of electronic components 22 mounted along the substrate 21, a resin part 121 covering the electronic components 22 and in close contact with the substrate 21, and a frame 122 covering the resin part 121.

The resin part 121 is, like the resin part 111 of the seventh embodiment, a resin member having high heat conductivity and reinforcing property, and examples thereof include those obtainable by adding silica ($SiO_2$), alumina ($AlO_2$), silicon carbide (SiC), AlN, carbon (C), or general electro-conductive fillers such as Cu, Au, AG, and Ni to an epoxy-based resin.

The frame 122 is formed of a metal frame 123 provided around the resin part 121 and a metal cover 124 covered on the metal frame 123 and serves as a shielding material.

In the substrate structure 120, the display device 30 that is one of the components is deposed on the metal cover 124 of the frame 122.

Specifically, the metal cover 124 has an upper surface 124A having a rectangular shape having an area S1. The display device 30 has a lower surface 30A having a rectangular shape having an area S2. A relationship between the area S1 and the area S2 is S1>S2.

By disposing the lower surface 30A of the display device 30 at substantially the center of the upper surface 124A, a planar outline of the resin part 124 is prevented from deviating from a planar outline of the display device 30.

Since the display device 30 is disposed in such a fashion that the planar outline of the display device 30 is prevented from deviating from the planar outline of the upper surface 124A, damage is hardly or never caused on the display device 30, resin part 121, and the like when a load is applied on the display device 30, thereby making it possible to improve strength as compared to the conventional examples.

When the lower surface 30A of the display device 30 is shifted by a certain degree from the upper surface 124A, it is possible to achieve the same effect by establishing a state in which the lower surface 30A does not deviate from the upper surface 124A by disposing the end face of the metal cover 124 and the end face of the display device 30 along an identical plane.

Though the example of the frame 122 formed of the metal frame 123 and the metal cover 124 on which the display device 30 is disposed is described in the eighth embodiment, the embodiment is not limited thereto, and the following Modification Examples 1 and 2 are also possible.

MODIFICATION EXAMPLE 1

By forming the frame 122 only from the metal frame 123, the display device 30 is disposed on an upper surface 121A of the resin part 121.

With such constitution, it is possible to dispose the planar outline of the display device 30 in such a fashion that the planar outline of the display device 30 is prevented from deviating from the planar outline of the upper surface 121A of the resin part 121. Therefore, damage is hardly or never caused on the display device 30, the resin part 121, and the like when a load is applied on the display device 30, thereby making it possible to improve strength as compared to the conventional examples.

MODIFICATION EXAMPLE 2

By forming the frame 122 only from the metal frame 123, an upper rim 123A of the metal frame 123 and the upper surface 121A of the resin part 121 are aligned along an identical a plane, and the display device 30 is disposed on the upper rim 123A and the upper surface 121A.

With such constitution, it is possible to dispose the planar outline of the display device 30 in such a fashion that the planar outline of the display device 30 is prevented from deviating from the planar outline of the upper surface 121A of the resin part 121 and the planar outline of the upper rim 123A of the metal frame 123. Therefore, damage is hardly or never caused on the display device 30, the resin part 121, and the like when a load is applied on the display device 30, thereby making it possible to improve strength as compared to the conventional examples.

MODIFICATION EXAMPLE 3

By forming the frame 122 only from the metal frame 123, the display device 30 is disposed on an upper rim 123A of the metal frame 123.

With such constitution, it is possible to support the display device 30 by the upper rim 123A of the metal frame 123. Therefore, damage is hardly or never caused on the display device 30, the resin part 121, and the like when a load is applied on the display device 30, thereby making it possible to improve strength as compared to the conventional examples.

The shapes and the sizes of the reinforcing heat discharge layer 26, the shield layer 27, and the display device 30 described in the first to the sixth embodiments may be changed as required.

Also, though the display device 30 is described as another member in the first to the sixth embodiments, the another member is not limited to the display device 30, and members other than the display device may be used as the another member.

Further, though the display device 30 is described as one of the components in the seventh and eighth embodiments, a keyboard, touch panel, a storage cell, and the like may be used as the one of the components.

INDUSTRIAL APPLICABILITY

This invention is suitably applied to substrate structures wherein: plural electronic components are disposed along a substrate; the electronic components are covered with a resin part; and the resin part is in close contact with the substrate.

The invention claimed is:
1. A substrate structure, comprising:
a substrate;
a plurality of electronic components mounted on the substrate;
a resin part including a reinforcing heat discharge layer and a shield layer,
the reinforcing heat discharge layer coating the electronic components and having a heat conductivity and a reinforcing property, and
the shield layer being provided on the reinforcing heat discharge layer;
wherein a platform is provided by a surface of the shield layer, the platform being configured to receive a device other than the plurality of electronic components; and
wherein an upright wall part is provided around a periphery of the platform and surrounds the device when present.
2. The substrate structure according to claim 1, wherein a recessed part corresponding to a projection of the device is provided on the platform.
3. The substrate structure according to claim 1, wherein the device is a display device, the platform having a lower end and an upper end and being inclined upward from the lower end to the upper end, the platform forming a light guiding plate inclined surface for the display device, and any of the electronic components having a large mounting height among the electronic components is/are adjacent the upper end of the platform.
4. The substrate structure according to claim 1, wherein the device is a display device, and at least one of the platform and the wall part is provided with a reflection layer.

5. The substrate structure according to claim 4, wherein the reflection layer is a sheet disposed on a surface of the resin part.

6. The substrate structure according to claim 4, wherein the reflection layer is coated on the surface of the resin part.

7. The substrate structure according to claim 1, wherein a metal plate is exposed to the surface of the shield layer.

* * * * *

UNITED STATES PATENT AND TRADEMARK OFFICE
CERTIFICATE OF CORRECTION

PATENT NO. : 7,969,741 B2
APPLICATION NO. : 12/065177
DATED : June 28, 2011
INVENTOR(S) : Haruo Hayakawa et al.

It is certified that error appears in the above-identified patent and that said Letters Patent is hereby corrected as shown below:

Title Page 2 Item 56:
"JP 2000-2602217 9/2000" should read, --JP 2000-260217 9/2000--.

Signed and Sealed this
Sixteenth Day of August, 2011

David J. Kappos
*Director of the United States Patent and Trademark Office*